United States Patent
Rolland et al.

(10) Patent No.: US 11,081,466 B2
(45) Date of Patent: Aug. 3, 2021

(54) METHOD FOR JOINING A MICORELECTRONIC CHIP TO A WIRE ELEMENT

(71) Applicant: PRIMO1D, Grenoble (FR)

(72) Inventors: Delphine Rolland, Grenoble (FR); Christopher Mackanic, Le Versoud (FR); Gianfranco Andia Vera, Grenoble (FR); Emmanuel Arene, Biviers (FR)

(73) Assignee: PRIMO1D, Grenoble (FR)

( * ) Notice: Subject to any disclaimer, the term of this patent is extended or adjusted under 35 U.S.C. 154(b) by 36 days.

(21) Appl. No.: 16/606,684

(22) PCT Filed: Apr. 16, 2018

(86) PCT No.: PCT/FR2018/050955
§ 371 (c)(1),
(2) Date: Oct. 18, 2019

(87) PCT Pub. No.: WO2018/193198
PCT Pub. Date: Oct. 25, 2018

(65) Prior Publication Data
US 2020/0335475 A1    Oct. 22, 2020

(30) Foreign Application Priority Data
Apr. 19, 2017 (FR) ...................... 1753404

(51) Int. Cl.
*H01L 21/67* (2006.01)
*H01L 23/00* (2006.01)
*H01L 21/683* (2006.01)

(52) U.S. Cl.
CPC ........ *H01L 24/85* (2013.01); *H01L 21/67138* (2013.01); *H01L 21/6838* (2013.01);
(Continued)

(58) Field of Classification Search
CPC . H01L 2224/85001; H01L 2224/85005; H01L 2224/852; H01L 2224/8521–8523;
(Continued)

(56) References Cited

U.S. PATENT DOCUMENTS 8,093,617 B2    1/2012 Vicard et al.
8,471,773 B2    6/2013 Vicard et al.
(Continued)

FOREIGN PATENT DOCUMENTS

EP    2390194 A1    11/2011
EP    2429006 A3    4/2012
(Continued)

OTHER PUBLICATIONS

International Search Report for International Application No. PCT/FR2018/050955 dated Jul. 30, 2018, 3 pages.
(Continued)

*Primary Examiner* — Scott B Geyer
(74) *Attorney, Agent, or Firm* — TraskBritt

(57) ABSTRACT

A method for joining a microelectronic chip to at least one wire element comprises a first step of applying a cover to a first face of the microelectronic chip, the cover being configured to form, with the first face, at least one temporary side groove. The method additionally comprises a step of inserting the wire element into the temporary groove. The method further comprises a step of attaching the wire element to the microelectronic chip. The method additionally comprises a step of removing the cover from the microelectronic chip.

20 Claims, 5 Drawing Sheets

(52) U.S. Cl.
CPC .... *H01L 24/78* (2013.01); *H01L 2224/85005* (2013.01); *H01L 2224/8521* (2013.01); *H01L 2224/8592* (2013.01); *H01L 2224/85234* (2013.01); *H01L 2224/85815* (2013.01)

(58) Field of Classification Search
CPC . H01L 2224/85234; H01L 2224/85238; H01L 2224/858–8583; H01L 2224/8592; H01L 21/67138; H01L 21/67121; H01L 21/6838; H01L 24/745; H01L 24/78
See application file for complete search history.

(56) References Cited

U.S. PATENT DOCUMENTS

| | | |
|---|---|---|
| 8,723,312 B2 | 5/2014 | Brun et al. |
| 8,782,880 B2 | 7/2014 | Vicard et al. |
| 8,814,054 B2 | 8/2014 | Brun et al. |
| 2015/0230336 A1 | 8/2015 | Vicard et al. |
| 2015/0318409 A1 | 11/2015 | Vicard et al. |

FOREIGN PATENT DOCUMENTS

| | | |
|---|---|---|
| EP | 2897084 A1 | 7/2015 |
| EP | 2339618 B1 | 12/2018 |
| WO | 2008/080245 A2 | 7/2008 |
| WO | 2009/112644 A1 | 9/2009 |
| WO | 2014/041107 A1 | 3/2014 |

OTHER PUBLICATIONS

International Written Opinion for International Application No. PCT/FR2018/050955 dated Jul. 30, 2018, 5 pages.

METHOD FOR JOINING A MICORELECTRONIC CHIP TO A WIRE ELEMENT

CROSS-REFERENCE TO RELATED APPLICATIONS

This application is a national phase entry under 35 U.S.C. § 371 of International Patent Application PCT/FR2018/050955, filed Apr. 16, 2018, designating the United States of America and published as International Patent Publication WO 2018/193198 A1 on Oct. 25, 2018, which claims the benefit under Article 8 of the Patent Cooperation Treaty to French Patent Application Ser. No. 1753404, filed Apr. 19, 2017.

TECHNICAL FIELD

The present disclosure relates to a process for assembling a microelectronic chip on a wire element. It finds an exemplary application in the field of RFID ("Radiofrequency Identification") electronic tagging to directly associate an antenna with a transmission chip and provide a particularly small radiofrequency device by simple manufacture. This device can be integrated into a textile thread and this thread itself can be integrated into a wide variety of objects for the identification, tracking, and administration thereof. More generally, it can be used in all areas that can benefit from the integration of an electronic chip, such as a sensor, an actuator, a light-emitting diode, or a solar cell with a wire element such as a textile yarn or a conductive wire for integration into an object.

In some cases, the electronic chip may be electrically connected to the electrically conductive wire itself. In other cases, the electrical conductor wire may be inductively coupled to an inductor housed in the electronic chip, without direct electrical contact between the chip and the wire. In still other cases, at least one wire that can be of a varied nature (not necessarily an electrical conductor) will be able to ensure the mechanical maintenance of the electronic chip comprising an autonomous component (for example, self-powered by a micro-capacity integrated into the chip).

BACKGROUND

For example, the technology used to assemble a wire and a chip known as E-THREAD™ is known from the documents U.S. Pat. Nos. 8,093,617, 8,471,773, 8,723,312, US2015318409, U.S. Pat. Nos. 8,782,880, 8,814,054 or US2015230336.

With this technology, the chip has a lateral groove and a longitudinal section of the wire is inserted into this groove. The assembly can be obtained by embedding the wire in the groove, the dimensions of the wire and of the groove then being sufficiently adjusted to mechanically join the two elements to each other. In addition, the assembly can be obtained or reinforced by adding an adhesive material between the wire and the chip, or by soldering or brazing the wire and the chip.

In document U.S. Pat. No. 8,093,617, the lateral groove can be obtained by assembling two elementary chips, each comprising a small parallel base and a large parallel base connected by at least one inclined lateral face; the assembly of the elementary chips by their small bases allows the lateral groove of the chip to be formed. In US2015230336, the assembly of a chip and a cover made from a stack of electrically insulating layers also forms at least one lateral groove.

The formation of grooves by assembly or engraving on the side faces of a chip is a delicate operation but also constraining in terms of the chip's structural configuration. However, the absence of grooves on the chip makes it difficult to accurately position the wires and assemble them reliably on the chip, especially in an industrial context where it is necessary to maintain a high production rate.

BRIEF SUMMARY

An object of the present disclosure is to provide a solution avoiding all or part of the disadvantages the solutions of the prior art. An object of the present disclosure is to propose a process for assembling a microelectronic chip on a wire element, relaxing the constraints on the shape of the chip and allowing a precise and reliable fixing of the wire element on the chip.

In order to achieve one of these goals, the present disclosure proposes a process for assembling a microelectronic chip on at least one wire element; the assembly process comprising:

A first step of applying a cover to a first face of the microelectronic chip, the cover being configured to form with the first face at least one temporary lateral groove;

A step of inserting the wire element into the temporary groove;

A step of fixing the wire element on the microelectronic chip; and

A step of removing the cover from the microelectronic chip.

According to other advantageous and non-limiting characteristics of the present disclosure, taken alone or in any technically feasible combination:

the cover has a contact face applied to the first face of the microelectronic chip and having at least one shoulder to form the temporary lateral groove with the first face;

the contact face applied to the first face has two shoulders to form two parallel temporary lateral grooves, with the first face;

the first face of the microelectronic chip has at least one shoulder to form the temporary lateral groove with a contact face of the cover;

the first side of the microelectronic chip has two shoulders to form two parallel temporary lateral grooves, with the contact side of the cover;

the first step of applying the cover to the first face of the microelectronic chip comprises maintaining contact between the contact face of the cover and the first face by vacuum;

during the insertion step, a longitudinal portion of the wire element is inserted at least partially into the temporary lateral groove;

the assembly process comprises a second step of applying a holder on a second side of the microelectronic chip, to stiffen the microelectronic chip at least during the step of inserting the wire element;

the microelectronic chip comprises at least one stud on its first side, located in the area forming a first flank of the temporary groove when the cover is applied to the first face;

the fixing step is carried out between the wire element and the stud;

the cover is made of a material to which the material from which the stud is made does not adhere;

the wire element and the stud comprise at least one electrically conductive material;

the fixing step includes a sequence of heating located near the temporary groove, to melt the stud against the wire element;

the cover includes a heating means for the implementation of the heating sequence;

the cover is attached to the end of an articulated arm of a chip handling device;

the assembly process comprises, after the step of removing the cover, a reinforcement step involving the dispensation of an adhesive on at least a part of the wire element fixed on the microelectronic chip; and the assembly process comprises, after the step of removing the cover, a step of encapsulating the microelectronic chip and at least the longitudinal portion of the wire element fixed on the chip.

BRIEF DESCRIPTION OF THE DRAWINGS

Further characteristics and advantages of the present disclosure will be clear from the following detailed description, made in reference to the appended figures. The figures are schematic representations that, for the sake of clarity, are not necessarily to scale.

DETAILED DESCRIPTION

For the sake of clarity, only the steps and elements useful for understanding embodiments of the present disclosure have been represented and will be described. In particular, the components (e.g., radio-frequency transmission components) developed on microelectronic chips have not been detailed, as the present disclosure is compatible with standard devices (e.g., measurement sensors, object identifiers), depending on the application concerned. The steps of collective manufacturing of microelectronic chips on a substrate have also not been detailed, as the present disclosure is again compatible with microelectronic chips developed using conventional techniques.

Figure 1A:
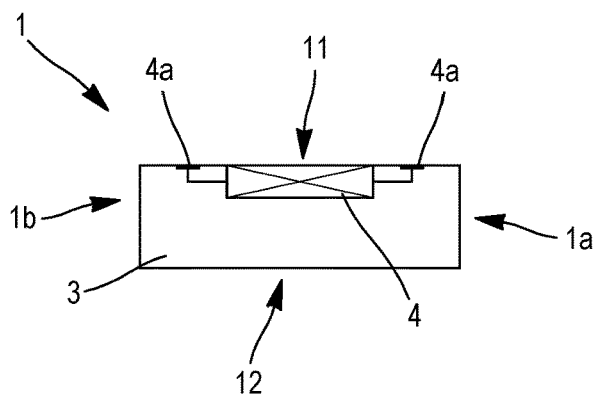
FIG. 1A shows a microelectronic chip compatible with the assembly process according to the present disclosure.

FIG. 1A shows a microelectronic chip 1 (also referred to as a "chip" in the following description) comprising a microelectronic component, compatible with the assembly process according to the present disclosure.

The microelectronic chip 1 comprises a substrate 3 having a microelectronic component 4, such as an emitting-receiving circuit, a calculation device, a sensor, a LED or any other form of integrated circuit provided on the substrate 3, for example, using techniques known in the semiconductor field. The microelectronic component 4 is located on the upper side of chip 1, which is referred to as the first side 11 (or first face) of microelectronic chip 1. To protect the microelectronic component 4, a protective layer is advantageously placed on the surface of substrate 3.

The lower side of the chip 1 is referred to as the second side 12.

The microelectronic component 4 can be electrically connected to one or more connection terminal(s) 4a opening on the first side 11 of the microelectronic chip 1, using tracks or via conductors formed on or within substrate 3. Alternatively, the connection terminals could be present on the second side 12 of chip 1.

The figures, for simplicity, represent chips 1 with two connection terminals 4a on their first side 11, although the presence of these connection terminals 4a is optional.

Figure 4A:
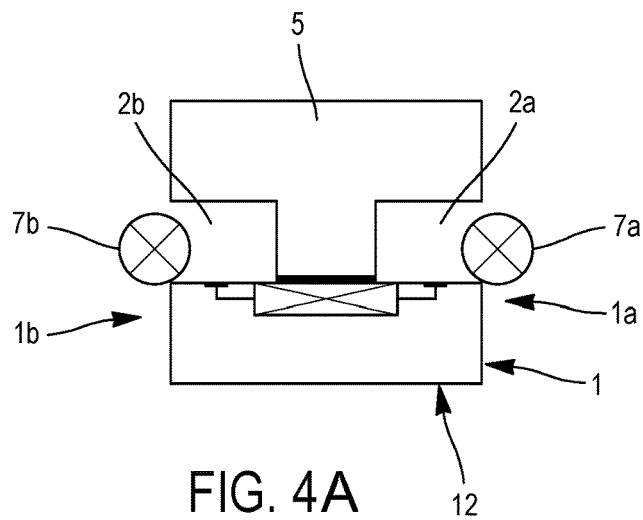
FIGS. 4A and 4B show a step of inserting a wire element into a temporary groove, of the assembly process according to the present disclosure, respectively in cross-sectional and perspective view.
Figure 4B:
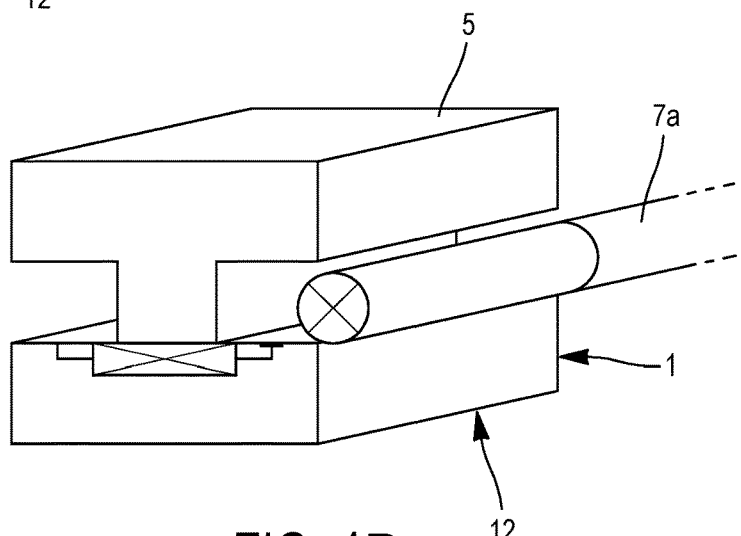
Figure 4C:
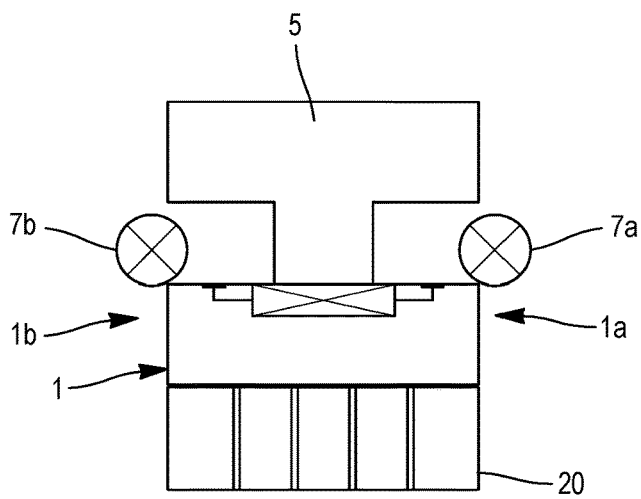
FIG. 4C shows a step of inserting a wire element into a temporary groove, of the assembly process according to the present disclosure.

The assembly process according to the present disclosure allows the microelectronic chip 1 to be assembled with at least one wire element 7a, 7b (illustrated in FIGS. 4A-4C).

The assembly of chip 1 with the wire element 7a, 7b can have a purely mechanical function. In such embodiments, the wire element 7a, 7b constitutes a mechanical support for chip 1. In such a case, it is not necessary to provide one or more connection terminals 4a on the first side 11 of chip 1, as the wire element 7a, 7b is not intended to establish electrical contact with chip 1.

The wire element 7a, 7b may be of any nature, in particular, textile, polymer, metal, etc.

Alternatively, it may be advantageous for many applications to make an electrical contact between the connection terminals 4a of chip 1 and the wire element 7a, 7b. In this case, the connection terminals 4a are advantageously placed on the first side 11 of chip 1 and the wire element 7a, 7b is an electrical conductor.

According to yet another alternative, the microelectronic chip 1 can be assembled to two wire elements 7a, 7b, one electrically conductive to establish an electrical contact with a connection terminal 4a and the other of any nature to ensure a purely mechanical support of chip 1.

The wire element 7a, 7b may be of any nature (subject to the scenarios set out above) provided that it is sufficiently resistant to the mechanical and potentially chemical treatments to which it is likely to be exposed.

Especially in the case where the wire is to be electrically connected to a terminal 4a of microelectronic component 4 of chip 1, the wire element 7a, 7b is an electrically conductive wire, for example, made of stainless steel or a copper-based alloy or copper. The wire element 7a, 7b can also be made up of any type of conductive textile fibers.

The assembly process comprises several steps, and first a step of applying a removable cover 5 to a first side 11 of the microelectronic chip 1, the cover 5 being configured to form with the first side 11 at least one temporary lateral groove 2a, 2b (FIGS. 1C, 3, 4A, and 5), along at least one side face 1a, 1b (FIGS. 1A, 2A, 4A, and 4C) of the microelectronic chip 1.

Figure 1B:
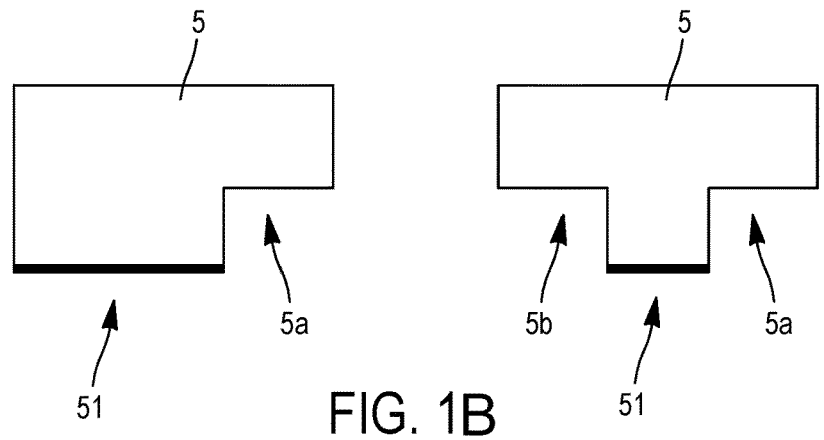
FIG. 1B shows removable covers, according to a first embodiment, compatible with the assembly process according to the present disclosure.
Figure 1C:
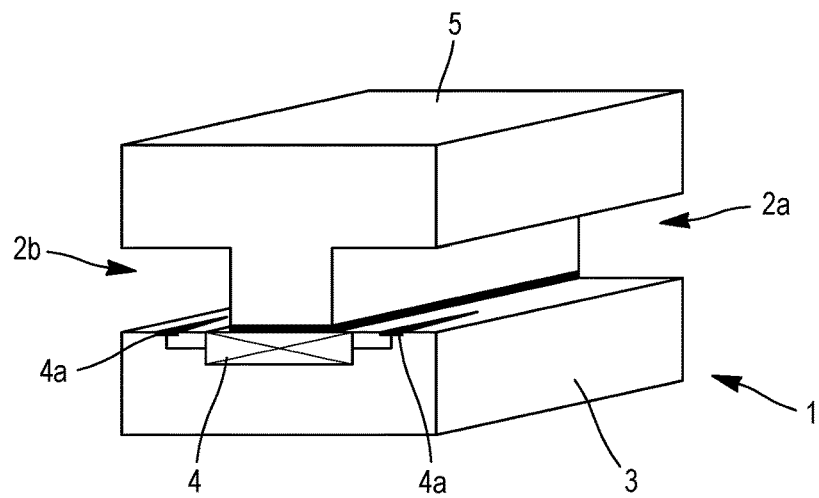
FIG. 1C shows a step of applying a cover to a microelectronic chip, of the assembly process according to the present disclosure.

According to a first embodiment, cover 5 has a contact face 51 intended to be applied to the first face 11 and having at least one shoulder 5a, 5b (FIG. 1B). This shoulder 5a, 5b makes it possible to form the temporary lateral groove 2a, 2b with the first side 11 of the microelectronic chip 1 when the cover 5 is applied to the chip 1 (FIG. 1C). According to this embodiment, the first side 11 is flat (or substantially flat after the manufacturing steps of the microelectronic component) and it is not necessary to create a specific groove. Advantageously, as shown in FIG. 1C, contact face 51 of cover 5, applied to the first face 11, has two shoulders 5a, 5b to form two parallel temporary lateral grooves 2a, 2b, with the first flat face 11 of the microelectronic chip 1.

Of course, the contact face 51 of cover 5 may have any number of shoulders, capable of forming temporary grooves, each arranged in any orientation, without departing from the scope of the present disclosure.

The geometric shape of groove 2a, 2b is not limited to a general parallelepiped shape; indeed, shoulder 5a, 5b of cover 5 can have the shape of a slot (FIG. 1B) but also a bevel or have a rounded concave flank, which can generate a groove 2a, 2b of a different shape.

Figure 2A:
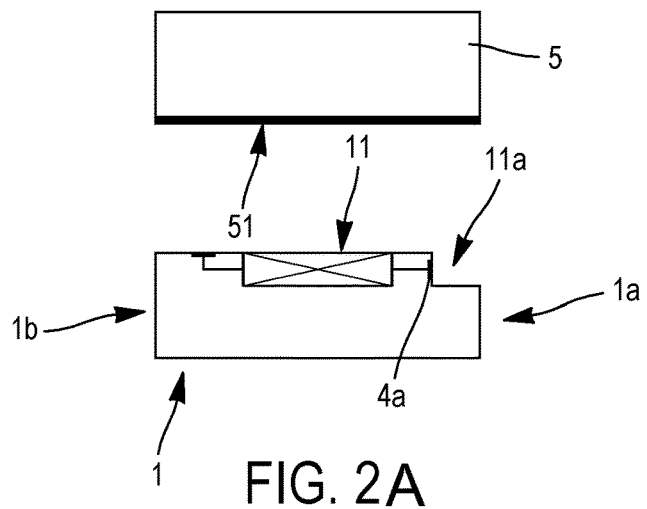
FIG. 2A shows another microelectronic chip and a removable cover, according to a second embodiment, compatible with the assembly process according to the present disclosure.
Figure 2B:
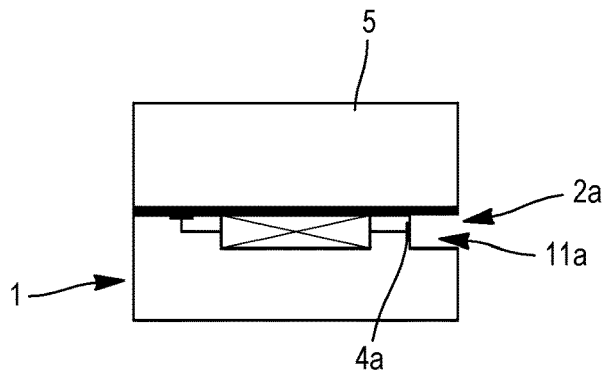
FIG. 2B shows a step of applying a cover to a microelectronic chip, of the assembly process according to the present disclosure.

According to a second embodiment of the present disclosure, illustrated in FIGS. 2A and 2B, the cover 5 has a flat contact face 51 and the first face 11 of the microelectronic chip 1 has at least one shoulder 11a, to form the temporary groove 2a lateral with the flat contact face 51 of cover 5. The connection terminal 4a can, in this embodiment, be designed in such a way that it leads to the first flank, in the plane of the first face 11, of the shoulder 11a (not shown) or to the other substantially vertical flank of the shoulder 11a (as shown in FIGS. 2A and 2B).

According to an advantageous variant (not shown), the first side 11 of the microelectronic chip 1 has two shoulders along each of its lateral faces 1a, 1b to form two parallel temporary lateral grooves 2a, 2b, with the flat contact face 51 of the cover 5.

Of course, the first side 11 of chip 1 may alternatively have any number of shoulders, capable of forming temporary grooves, each arranged in any orientation.

According to a third embodiment (not shown), cover 5 and chip 1 each have at least one shoulder to form at least one temporary lateral groove 2a, 2b when cover 5 is applied to the first side 11 of chip 1.

The three embodiments described for the implementation of the process make it possible to relax the shape constraints of the microelectronic chip 1 to be assembled on the wire element 7a, 7b, because it is not necessary to form a specific groove on the chip itself. According to the first embodiment, a chip 1 such as the produced by the manufacturing steps of the microelectronic component is compatible. According to the second and third embodiments, a simple engraving on the first side 11 is required to create the shoulder.

The first embodiment described will be used in the following description and figures. The characteristics that will be presented may nevertheless apply to all the embodiments of the process according to the present disclosure.

Figure 3:
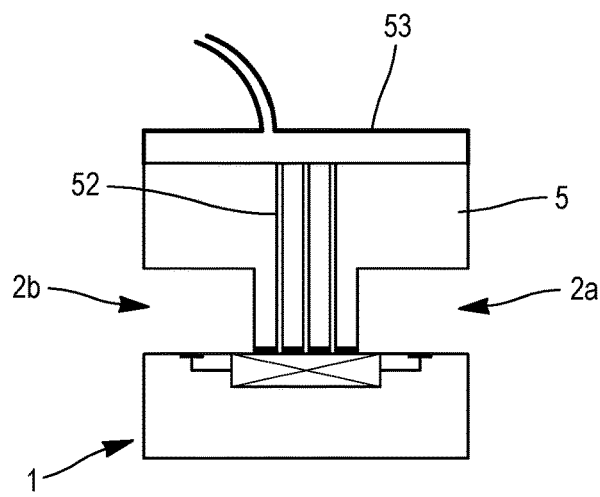
FIG. 3 shows a step of applying a cover to a microelectronic chip, of the assembly process according to the present disclosure.

The application step of the assembly process includes advantageously maintaining contact between the contact face 51 of cover 5 and the first face 11 of chip 1, for example, by vacuum. For this purpose, the cover 5 includes at least one channel 52 capable of connecting its contact face 51 to a suction system 53 (FIG. 3). The suction system 53 may, for example, include a vacuum pump, but the present disclosure is by no means limited to this embodiment, and any technique to maintain contact between cover 5 and chip 1 may be appropriate. In particular, cover 5 may be kept in contact with the first side 11 of chip 1 by the presence of a substance with low adhesive strength on its contact face 51.

The assembly process according to the present disclosure then includes a step of inserting the wire element 7a, 7b into the temporary groove 2a, 2b, as shown in FIGS. 4A and 4B. In the insertion step, a longitudinal portion of the wire element 7a, 7b is inserted into the temporary lateral groove 2a, 2b.

Optionally, the assembly process may include a second step of applying a holder 20 to the second side 12 of the microelectronic chip 1, before the insertion step. The presence of holder 20 allows chip 1 to be supported and stiffened, at least during the step of inserting the wire element 7a, 7b (FIG. 4C). For example, holder 20 may be kept in contact with the second side 12 of chip 1 by suction, or by the presence of a substance with low adhesive strength, or by the simple pressure applied by the cover 5.

According to the present disclosure, the height and depth dimensions of the temporary grooves 2a, 2b, which depend on the structural configuration of cover 5 (first or third embodiment) and/or the structural configuration of chip 1 (second or third embodiment), are chosen large enough that each wire element to be joined can be accommodated in a temporary groove 2a, 2b without mechanically forcing its embedding in the temporary groove 2a, 2b. To promote the connection of the wire element 7a, 7b to chip 1, it is generally preferable, for the longitudinal section of the wire elements to be able to be fully accommodated in the grooves 2a, 2b, i.e., the accommodated portion of each wire element does not extend beyond the face of the chip 1 on which the temporary groove 2a, 2b is formed.

When a plurality of temporary grooves 2a, 2b are present, they are not necessarily of the same size. Similarly, the wire elements 7a, 7b that are to be accommodated in the temporary grooves 2a, 2b are not necessarily of the same nature and do not necessarily have identical cross-sections.

Advantageously, microelectronic chip 1 includes at least one stud 6a, 6b on its first side 11, located in the area forming a first flank of the temporary groove 2a, 2b, when cover 5 is applied on the first side 11. This stud 6a, 6b, made of a bonding material, is intended to fix the wire element 7a, 7b on chip 1, during the fixing step of the assembly process that will be described hereinafter.

Figure 5:
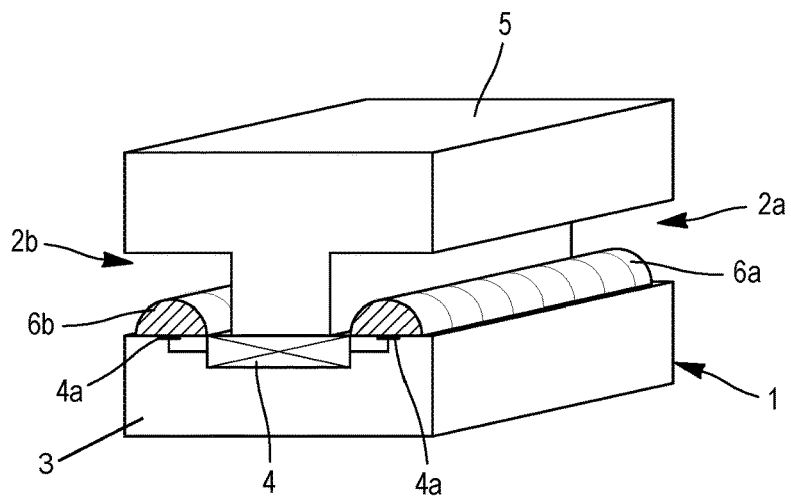
FIG. 5 shows a step of applying a cover to a microelectronic chip, of the assembly process according to the present disclosure.

In the example shown in FIG. 5, the studs 6a, 6b are arranged along the entire length of the area forming a first flank of each temporary groove 2a, 2b. In general, stud 6a, 6b may extend over at least part of the length of the first flank of the temporary lateral groove 2a, 2b.

It may also be possible to form each stud 6a, 6b of a plurality of elementary studs, distinct from each other, arranged over a more or less extensive length of the area of the first face 11 forming a first flank of the temporary groove 2a, 2b.

Whatever the shape, volume or arrangement of the studs 6a, 6b in the temporary grooves 2a, 2b, they are advantageously so large that it is not possible to perfectly accommodate the wire elements in the temporary grooves 2a, 2b without the wires establishing contact with the studs 6a, 6b. Each stud 6a, 6b forms a reserve of a bonding material that will allow the wire element 7a, 7b housed in a temporary groove 2a, 2b to be fixed to the chip 1.

As stated above, according to a first embodiment, the assembly of chip 1 on the wire element 7a, 7b may have only a mechanical function. In this case, the bonding material forming the studs 6a, 6b can be a simple adhesive substance, e.g., a polymer. It may be a viscous substance, which can be cured during the next fixing step and thus bond the wire element 7a, 7b and the chip 1 together.

The studs 6a, 6b are advantageously deposited prior to the application step of cover 5 on the first face 11 of chip 1.

According to a second embodiment, in which it is desired to establish an electrical connection between chip 1 and wire element 7a, 7b, the connecting material of stud 6a, 6b is chosen from electrically conductive materials. It may include a plurality of elemental compounds. For example, it may be an alloy of metals, such as tin, silver and copper. The material constituting each stud 6a, 6b is chosen so that its melting point is relatively low. This melting temperature is lower than the maximum temperature to which the microelectronic component 4 of the chip 1 can be exposed without causing damage. If, for example, this maximum temperature is 350° C., the material of the studs 6a, 6b should be chosen so that their melting temperature is lower than 350° C., for example, 300° C. Advantageously, for reasons of simplicity of implementation of the assembly process, this material is chosen so that its melting temperature is between 80° C. and 250° C., between 80° C. and 150° C., or even between 80° C. and 100° C. In addition, it is not necessary that all elementary studs 6a, 6b be made of the same material.

The studs 6a, 6b can be advantageously manufactured during the manufacture of chip 1, for example, by forming them by deposition on the substrate 3, in contact with the connection terminals 4a. The studs 6a, 6b are advantageously formed before the application step of cover 5 on the first face 11 of chip 1.

During the insertion step, a longitudinal portion of at least one wire element 7a, 7b is placed along the (at least one) temporary groove 2a, 2b. The wire element 7a, 7b is then submitted to limited forces to press it against stud 6a, 6b.

The assembly process according to the present disclosure also includes a step of fixing the wire element 7a, 7b on the microelectronic chip 1. In general, the fixing step uses a bonding material or adhesive substance to maintain contact between the wire element 7a, 7b and chip 1, even when the temporary cover 5 is no longer in contact with chip 1.

This bonding material or adhesive may have been dispensed before or after the application of cover 5 and the insertion of wire element 7a, 7b, as previously stated. Thus, the fixing step can be done by injecting an adhesive substance along the wire near the first face 11 of chip 1, after its insertion into the temporary groove 2a, 2b. The fixing step can also provide for the application of a bonding material, for example, by soldering.

Figure 6A:
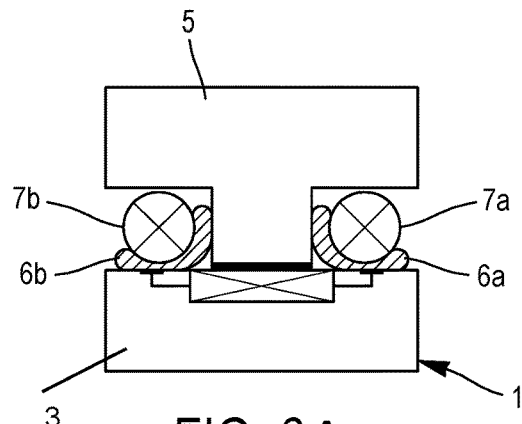
FIGS. 6A, 6B and 6C show variants of the step of fixing at least one wire element to a microelectronic chip, of the assembly process according to the present disclosure.

In the preferred method of application, studs 6a, 6b were previously formed in groove 2a, 2b. As shown in FIG. 6A, the fixing step solidarizes all or part of the longitudinal portion of the wire element 7a, 7b inserted in the temporary groove 2a, 2b on the first face 11 via the studs 6a, 6b.

In the first embodiment in which the studs 6a, 6b are formed by an adhesive substance not yet cured, the substance will deform when the wire element 7a, 7b is inserted and partially surround the wire element 7a, 7b. The fixing step is completed as soon as the adhesive substance has cured in order to ensure fixation. This curing may require the adhesive substance to be treated, for example, with ultraviolet radiation.

The material of the cover 5 or at least the material placed on the surface of cover 5 shall be chosen in such a way that the adhesive substance does not adhere to it, or will adhere only slightly, in order to prevent it from becoming fixed to cover 5, since the cover 5 is intended to be removed from the first face 11 of chip 1.

Figure 6B:
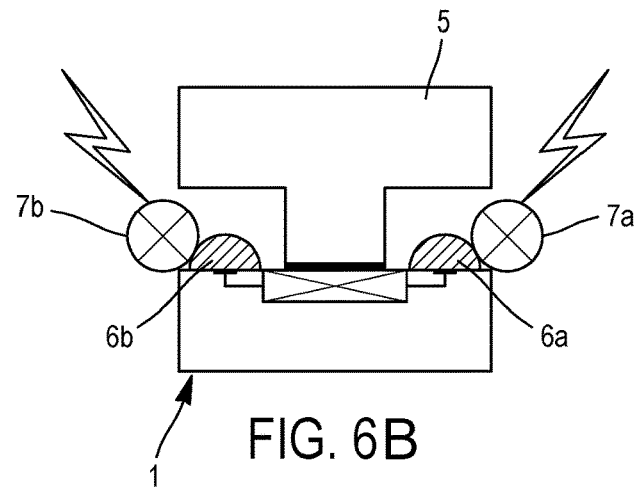

In the second embodiment in which the studs 6a, 6b are formed of a conductive material, for example, a metallic material, the fixing step includes a sequence of localized heating near the temporary groove 2a, 2b to melt the stud 6a, 6b against the wire element 7a, 7b (FIG. 6B).

The heating sequence can be carried out with a heating means, for example, a generator of an air flow or another heated fluid flow, by induction, or by electromagnetic irradiation such as laser irradiation or ultraviolet radiation, generating a heat flow defining the heated zone at chip 1.

Heating can alternatively be obtained by thermal conduction, for example, by heating the cover 5 by means of heating resistors incorporated in the mass of this cover 5. In this case, the heating means is integrated into the cover 5 itself.

Figure 6C:
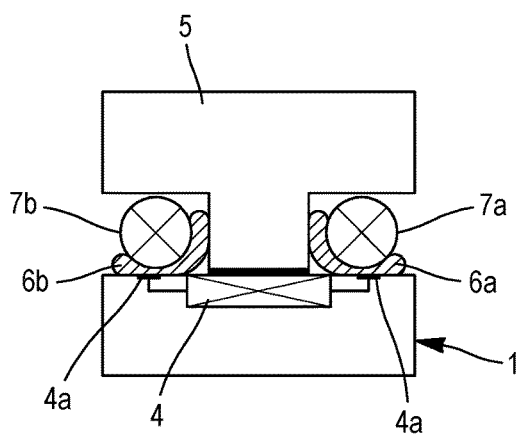

Thus, studs 6a, 6b are heated at a processing temperature above the melting point of the bonding material they contain, and for a sufficient time to melt it. The change of the bonding material into the liquid state, combined with the weak forces exerted on the wire element 7a, 7b to maintain it against the temporary groove 2a, 2b, leads to the partial coating of the wire element 7a, 7b into the temporary groove 2a, 2b, as shown in FIG. 6C. Of course, it is not necessary for the bonding material of studs 6a, 6b to entirely pass into the liquid state to cause this partial coating.

Once the heating sequence is complete, a temperature lower than the melting temperature of the bonding material is restored, typically the ambient temperature, which leads to the solidification of the bonding material. As a result, the wire element 7a, 7b is made integral with the first face 11 and can establish electrical contact with the connection terminals 4a of chip 1.

In this second embodiment, the cover is made of a material to which the conductive material of the studs 6a, 6b does not adhere in order to avoid adhesion of the studs 6a, 6b to the cover 5, which is intended, as described above, to be removed from the first face 11 of chip 1. For example, stud 6a, 6b, deposited and fixed on a connection terminal 4a of chip 1, could be made of an alloy of metals, for example, tin, silver and copper. The fixing step allows the wire element 7a, 7b, made, for example, of stainless steel, copper or a copper-based alloy, to be attached to stud 6a, 6b. Cover 5 may consist of a type of ceramic, silicon oxide, metal oxide or metal alloy, for example, coated with chromium, to which the tin-based solder (conductor material of stud 6a, 6b) does not adhere.

When the chip 1 has several temporary grooves 2a, 2b to accommodate several wire elements 7a, 7b, the fixing step can be carried out successively or simultaneously for each of the wire elements 7a, 7b. The zone exposed to the processing temperature may be large enough to at least partially include all the studs 6a, 6b. Alternatively, the insertion step may include the simultaneous or successive exposure of several distinct zones, each encompassing at least a portion of the studs 6a, 6b.

Figure 6D:
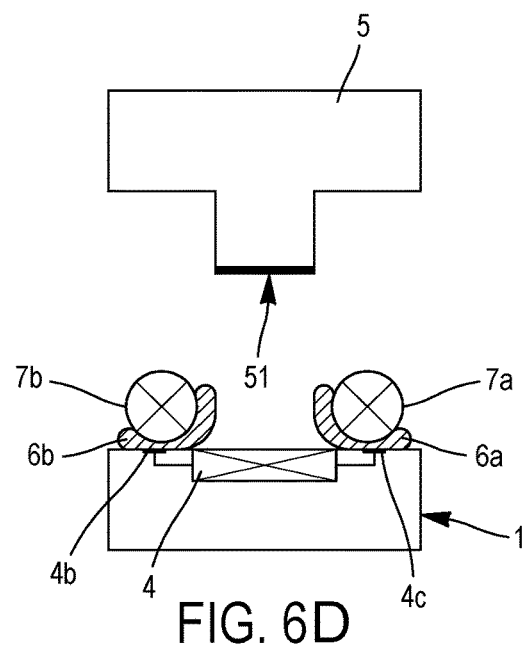
FIG. 6D shows a step of removing a cover, of the assembly process according to the present disclosure.

Lastly, the assembly process according to the present disclosure includes a step of removing the cover 5 from the microelectronic chip 1 (FIG. 6D), after the fixing step described above. The contact face 51 is then separated from the first face 11 of chip 1. For example, the removal step may include interrupting the vacuuming of channels 52, which stops the suction contact between contact face 51 and first face of chip 1.

Cover 5 can be attached to the end of an articulated arm of a chip handling device such as an automatic "pick and place" machine. The articulated arm equipped with a suction nozzle will be able to grasp a chip 1 in a storage area and place it precisely in an assembly position, for example, on a holder 20, to successively apply and remove cover 5 from the first face 11.

The present disclosure takes advantage of the respective configurations of the cover 5 and the microelectronic chip 1 to form at least one temporary groove 2a, 2b in which a wire element 7a, 7b can be easily and precisely positioned. The fixing of the wire element 7a, 7b on chip 1, for example, by means of a stud 6a, 6b placed on the first face 11 of chip 1, allows the attachment and mechanical resistance of the chip/wire assembly. Cover 5 can then be removed from chip 1 and applied to another chip 1. The process according to the present disclosure can be repeated and allows the assembly of a plurality of microelectronic chips 1 on at least one wire element 7a, 7b, to form a chain of chips 1.

The assembly process according to the present disclosure offers a solution that relaxes the stresses on the shape of the chip (and, in particular, on the presence of grooves) and allows a precise and reliable fixing of the wire element 7a, 7b on chip 1, due to the presence of the temporary groove 2a, 2b.

The assembly process according to the present disclosure may also include additional steps, after the wire element(s) 7a, 7b have been assembled on chip 1 and the cover 5 has been removed.

Figure 7A:
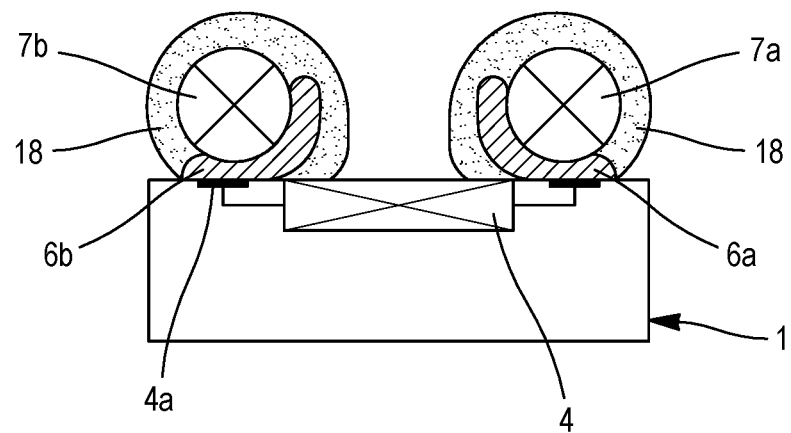
FIGS. 7A and 7B show complementary steps of respectively reinforcing and encapsulating an assembled chip and wire element assembly.

Thus, the process may include a step of reinforcing the assembly formed by chip 1 and the wire element(s) 7a, 7b. The reinforcement step may include dispensing an adhesive 18 on at least part of the wire element attached to the microelectronic chip 1, as shown in FIG. 7A. Dispensing the adhesive 18 can be complemented by the curing thereof, for example, by UV treatment, which can be very short, of the order of one second or a few seconds, to stiffen the adhesive and promote the attachment thereof to the elements with which it is in contact.

Figure 7B:
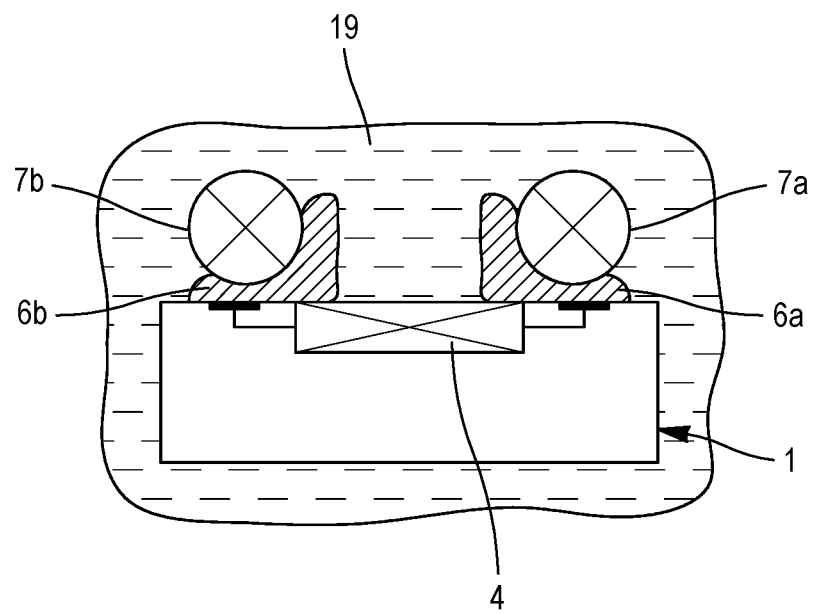

The process may also include, as a complementary step, a step of encapsulating the microelectronic chip 1 and the longitudinal portion of the wire element 7a, 7b fixed on the chip, in a sufficiently rigid and waterproof material 19, such as resin, to protect the assembly from mechanical or chemical stresses in its final application (FIG. 7B). Preferably, this encapsulation is such that all sides of chip 1 are well covered with the encapsulating material.

The encapsulation step can be done with or without a pre-strengthening step.

The process may also include, as a complementary step, a step of cutting one or more wire element(s) 7a, 7b. This may involve sampling one segment of the chain for its integration into an object. It may also involve cutting a portion of the wire element 7a, 7b to form a dipole antenna connected to chip 1, thus constituting a transmission circuit as taught in the document U.S. Pat. No. 8,471,773. The cutting of the wire element 7a, 7b can be carried out by any means known per se, for example, by using a mechanical shearing tool or by laser cutting.

Of course, the invention is not limited to the described embodiments and alternative solutions can be used without departing from the scope of the invention, as defined in the claims.

The invention claimed is:

1. A method of assembling a microelectronic chip on at least one wire element, comprising:
    applying a cover to a first face of the microelectronic chip, the cover being configured to form, with the first face, at least one temporary lateral groove;
    inserting the at least one wire element into the temporary groove;
    fixing the at least one wire element to the microelectronic chip; and
    removing the cover from the microelectronic chip.

2. The method of claim 1, wherein the cover has a contact face and at least one shoulder, the method further comprising applying the contact face to the first face of the microelectronic chip to form the temporary lateral groove with the first face.

3. The method of claim 2, wherein the first face of the microelectronic chip has at least one shoulder to form the temporary lateral groove with a contact face of the cover.

4. The method of claim 3, wherein applying the cover to the first face of the microelectronic chip comprises maintaining contact between the contact face of the cover and the first face by vacuum.

5. The method of claim 4, wherein inserting the at least one wire element into the temporary groove comprises inserting a longitudinal portion of the at least one wire element at least partially into the temporary lateral groove.

6. The method of claim 5, further comprising applying a holder to a second face of the microelectronic chip at least while inserting the at least one wire element into the temporary groove.

7. The method of claim 6, further comprising providing at least one stud on the first face of the microelectronic chip in an area forming a first flank of the temporary groove when the cover is applied to the first face.

8. The method of claim 7, wherein the fixing step takes place between the at least one wire element and the at least one stud.

9. The method of claim 7, wherein the cover comprises a material to which a material of the at least one stud will not adhere.

10. The method of claim 7, wherein the at least one wire element and the at least one stud comprise an electrically conductive material.

11. The method of claim 7, wherein fixing the at least one wire element to the microelectronic chip comprises localized heating near the temporary groove and melting the at least one stud against the wire element.

12. The method of claim 11, wherein the cover comprises a heating device for the localized heating near the temporary groove.

13. The method of claim 1, wherein the cover is fixed to an end of an articulated arm of a chip handling device.

14. The method of claim 1, further comprising, after removing the cover, dispensing an adhesive on at least a portion of the at least one wire element fixed on the microelectronic chip.

15. The method of claim 1, further comprising, after removing the cover, encapsulating the microelectronic chip and at least a longitudinal portion of the at least one wire element fixed to the microelectronic chip.

16. The method of claim 1, wherein the first face of the microelectronic chip has at least one shoulder to form the temporary lateral groove with a contact face of the cover.

17. The method of claim 1, wherein applying the cover to the first face of the microelectronic chip comprises maintaining contact between the contact face of the cover and the first face by vacuum.

18. The method of claim 1, wherein inserting the at least one wire element into the temporary groove comprises inserting a longitudinal portion of the at least one wire element at least partially into the temporary lateral groove.

19. The method of claim 1, further comprising applying a holder to a second face of the microelectronic chip at least while inserting the at least one wire element into the temporary groove.

20. The method of claim 1, further comprising providing at least one stud on the first face of the microelectronic chip in an area forming a first flank of the temporary groove when the cover is applied to the first face.

* * * * *